United States Patent [19]

Gustafson et al.

[11] 4,086,539

[45] Apr. 25, 1978

[54] FIRST-ORDER PHASE-LOCK LOOP

[75] Inventors: Donald E. Gustafson, Lexington; Jason L. Speyer, Winchester, both of Mass.

[73] Assignee: Massachusetts Institute of Technology, Cambridge, Mass.

[21] Appl. No.: 280,026

[22] Filed: Aug. 11, 1972

[51] Int. Cl.² ............................................. H03B 3/06
[52] U.S. Cl. .................................. 328/155; 328/162; 328/167
[58] Field of Search ................ 328/155, 162, 165, 167

[56] References Cited
U.S. PATENT DOCUMENTS

| 2,931,901 | 4/1960 | Markusen | 328/167 |
|---|---|---|---|
| 3,299,362 | 1/1967 | Sandberg | 328/167 X |

*Primary Examiner*—John Zazworsky
*Attorney, Agent, or Firm*—Arthur A. Smith, Jr.; Robert Shaw

[57] ABSTRACT

A first order phase-lock loop that provides lower phase-error variance than classical systems at all frequencies when operated above threshold. The linear, minimum-variance filter described, in preferred form, employs three summers, two integrators, four system parameters, and two gain elements, the first and fourth system parameters being equal and the second and third system parameters being equal. The loop input, which contains a signal corrupted by noise, is connected as one input to the first summer whose output provides input to each of the gain elements. The first gain element is connected as one input to the second summer whose output is connected to the first integrator. The output of the first integrator, which is also the loop output and which is an estimate of the signal, is fed back negatively as one input to the first and second summers and as one negative input to the third summer. The first system parameter is connected in the feedback loop between the first integrator and the third summer, and the second system parameter is connected in the feedback loop between the first integrator and the second summer. The second integrator is connected to the output of the third summer; its output is fed through the third parameter negatively as a further input to the third summer and through the fourth system parameter as an input to the second summer. The second gain element is connected between the first and third summers. In certain circumstances the second gain element and/or the second and third system parameters (and their associated feedback loops) can be removed from the system.

5 Claims, 1 Drawing Figure

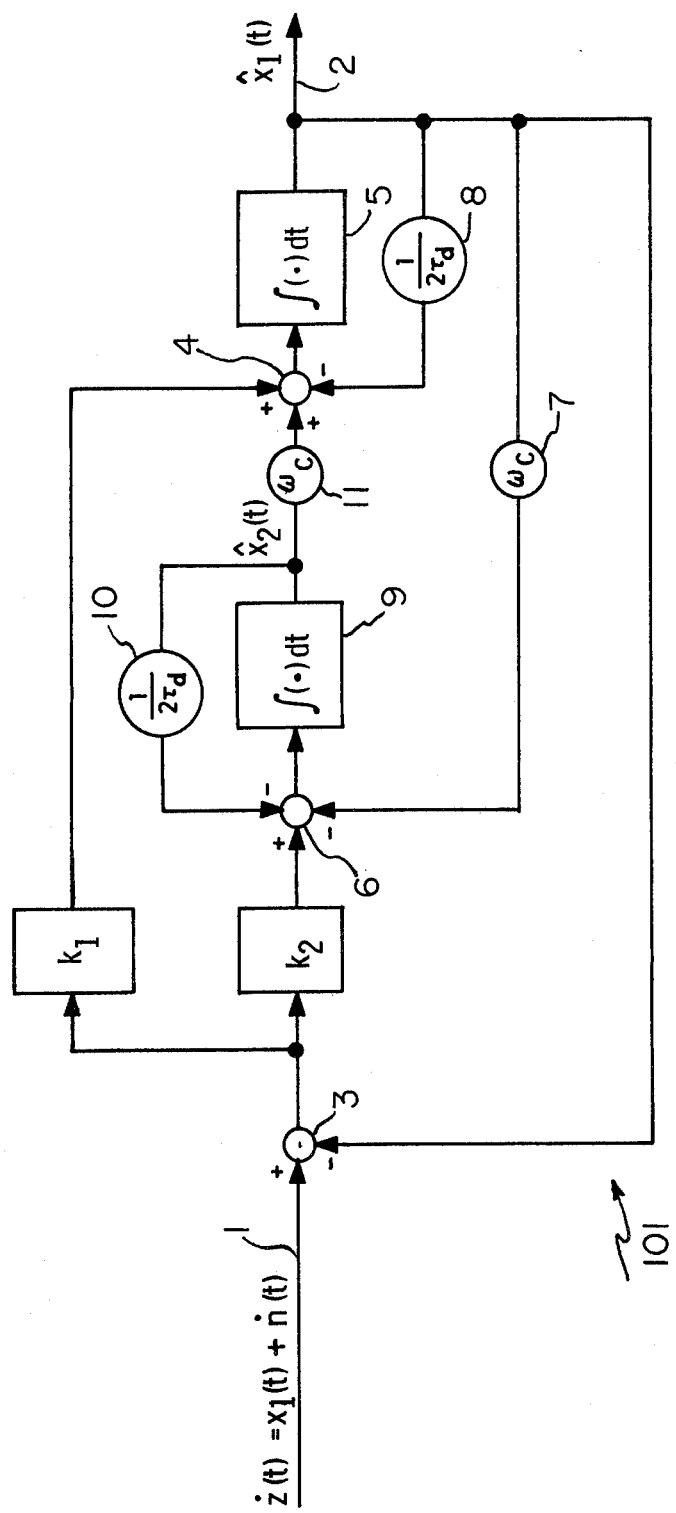

FIRST-ORDER PHASE-LOCK LOOP

The invention described herein was made in the performance of work under a National Aeronautics and Space Administration contract and is subject to the provisions of Section 305 of the National Aeronautics and Space Act of 1958, Public Law 85-568 (72 Stat. 435; 42 U.S.C. 4257.)

The present invention relates to phase-lock loops (PLL) and, in particular, to first-order phase-lock loops.

A first-order phase-lock loop may be used to solve the problem of synchronizing with the phase of an unmodulated sinusoidal carrier signal of constant amplitude corrupted by phase noise and additive channel noise. The phase noise is assumed to behave ideally as a Brownian motion process and the channel noise is assumed to behave ideally as white Gaussian noise.

The major theoretical innovation for this class of problems is that the dynamical equations, described in rectangular coordinates instead of the usual polar coordinates of amplitude and phase, form a two-state variable linear stochastic equation (called an Ito stochastic equation) with white noise multiplying the state variables. In this form the best unconditional linear estimate of the state can be found using the general theory presented in a paper entitled "Linear Minimum Variance Estimation in Systems with State-Dependent Noise with Application to Phase-Locked Loops" written by the present inventors. From the estimates of the two state variables the estimates of phase and amplitude can be calculated.

Phase-lock loops, generally, are discussed in a journal article entitled "The Monolithic Phase-Locked Loop; A Versatile Building Block" by Alan B. Grebene, published in the IEEE Spectrum, March 1971, pages 38, et seq. The phase-lock loops discussed in the article are of classical design and they produce very favorable results in terms of phase-error variance in high frequency systems and below threshold. The term "below threshold" denotes the region where the nonlinearity in the classical PLL is essentially linear (i.e. the sine of the error in the estimate of phase is approximately equal to the error in the estimate of phase). The performance of the classical PLL degenerates from its optimal performance as measured by phase error variance as the linearity assumption is violated or as the carrier frequency decreases.

In the analysis of the present invention there are no linearity assumptions nor restrictions on the carrier frequency as in the classical design. However, due in part to the assumed linear estimator structure (the true minimum variance estimator is obtained using a nonlinear estimator structure), there is a degradation in performance from the classical (optimal) phase lock loop below threshold at high frequencies of 6% in output phase error variance. Above threshold a Monte Carlo analysis was made on the present invention and the classical PLL, using algorithms programmed on a digital computer. The results show that the present invention is superior to the classical PLL. The phase error variance above threshold was reduced by up to 0.8 dB from that of the classical PLL. It is emphasized that the present invention is no more difficult to implement than the classical PLL.

Accordingly, an object of the present invention is to provide a phase-lock loop of increased accuracy as compared to loops of classical design when the loop is operated above threshold, and at all frequencies, i.e., a phase-lock loop which tracks a signal with minimum mean-square error using a linear filter.

A further object is to provide such a loop employing simple mechanization.

Other and still further objects are evident in the description that follows and are particularly pointed out in the appended claims.

In summary, the objects of the invention are embodied in a first-order phase-lock loop that includes first summer means to receive a loop input which contains a signal corrupted by noise; gain element means connected to receive as input thereto the output of the first summer means; second summer means connected to receive as an input thereto the output of the gain element; first integrator means connected to receive as input thereto the output of the second summer means and to provide an output which is an estimate of the signal, the output of the first integrator means being fed back negatively as an input to each of the first and second summer means and as one negative input to third summer means; first system parameter means connected in the feedback loop between the first integrator means and third summer; second system parameter means connected in the feedback loop between the first integrator and the second summer means; and second integrator means connected to receive as input thereto the output of the third summer means and to provide an output which is fed back to the third summer means through third system parameter means and as an input to the second summer means through fourth system parameter means. It should be noted that, in the preferred system, another gain element is connected between the first and third summers; also, for relatively phase-stable signals, the feedback loops containing the second and third system parameters may be removed with only a small amount of degradation in system performance.

The invention is hereinafter discussed with reference to the accompanying drawing which is a function diagram of the linear state-dependent noise phase-lock loop of the present invention.

Before going into a discussion of implementation of the present inventive concept in accordance with the function diagram, there now follow a few preliminary remarks. The system functions to extract from an input $\hat{z}(t)$ (the $t$ in parenthesis throughout denotes dependency on time) the linear, minimum-variance estimate of a signal $x_1(t)$ in the input corrupted by wide bandwidth (or white) noise $\dot{n}(t)$, where $\dot{z}(t) = x_1(t) + \dot{n}(t)$. The signal (i.e., the carrier) $x_1(t)$ is a fixed amplitude sine wave operating at a carrier frequency $\omega_c$ but with a random phase component described by Brownian motion. To accomplish the desired end, the input $\dot{z}(t)$ is introduced to an estimator in the form of an analog computer device (or electronic system wired to perform analog functions) which acts thereupon to extract said estimate which appears as an output from the device, or the signal can be introduced in digitized form to a digital computer programmed to perform the functions of the elements of the analog device. In either event, the estimation process is accomplished by an estimation system which performs the functions expressed mathematically as follows:

$$\dot{\hat{x}}_1(t) = -\frac{\hat{x}_1}{2\tau_d}(t) + \omega_c \cdot \hat{x}_2(t) + k_1(\dot{z}(t) - \hat{x}_1(t)) \quad (1)$$

-continued $$\hat{x}_2(t) = -\frac{\hat{x}_2}{2\tau_d}(t) - \omega_c \cdot \hat{x}_1(t) + k_2(\dot{z}(t) - \hat{x}_1(t)), \quad (2)$$

wherein $\hat{x}_1(t)$ is the estimate of the signal $x_1(t)$; $\hat{x}_2(t)$ is an intermediate variable which is an estimate of the signal which is 90° out of phase with the signal $x_1(t)$, $\dot{\hat{x}}_1(t)$ and $\dot{\hat{x}}_2(t)$ denote time differentiation of $\hat{x}_1(t)$ and $\hat{x}_2(t)$, respectively; $\dot{z}(t)$, as above noted, is the input to the estimation system; $1/(2\tau_d)$ and $\omega_c$ are system parameters; and $k_1$ and $k_2$ are first and second gain elements, respectively, found from the following relationships, $$0 = -\frac{N_o k_1}{2\tau_d} + \omega_c N_o k_2 + \frac{A}{\tau_d} - \frac{N_o}{2} k_1^2, \quad (3)$$

$$0 = -\frac{N_o k_2}{2\tau_d} + \omega_c \cdot x - \frac{N_o k_1}{2} - \frac{N_o k_1 k_2}{2}, \quad (4)$$

$$0 = -\omega_c N_o k_2 - \frac{x}{\tau_d} + \frac{A}{\tau_d} - \frac{N_o k_2^2}{2}, \quad (5)$$

wherein $x$ is a dummy variable; $\omega_c$ is the nominal carrier frequency, as well as first and fourth system parameters; $N_o/2$ is the channel noise spectral power density; A is the signal power of the signal $x_1(t)$; $\dot{\tau}_d$ is the time for rms transmitter phase error to reach one radian; and $(1/2\tau_d)$ is the second and third system parameters. Under certain circumstances the term $(1/2\tau_d)$ can be removed from the mechanization of the expressions (1) and (2) and the gain element $k_2$ can be removed from the expression (2). However, this is done after the calculations have been made for $k_1$ and $k_2$ from expressions (3), (4), and (5).

Referring to the FIGURE, a first order, phase-lock loop 101 is shown connected to receive at 1 an input $\dot{z}(t)$ which contains a signal $x_1(t)$ corrupted by noise $\dot{n}(t)$. The signal $x_1(t)$ is a constant-amplitude sine wave with a random phase component described by a Brownian motion process. The system 101 operates upon the input in such a fashion as to provide at the system output designated 2 an output $\hat{x}_1(t)$ which is the linear-minimum-variance estimate of the signal $x_1(t)$. The system 101 performs a filtering function, as now explained.

The input $\dot{z}(t)$ to the system 101 is received by a first summer 3. A first gain element $k_1$ is connected to receive as input thereto the output of the summer 3. A second summer 4 is connected, as shown, to receive as an input thereto the output of the first gain element $k_1$. A first integrator 5, connected to receive as input thereto the output of the second summer 4, serves to provide the output $\hat{x}_1(t)$ which is an estimate of the signal $x_1(t)$. The output $\hat{x}_1(t)$ of the first integrator 5 is fed back negatively as an input to each of the first and second summers and as one negative input to a third summer 6. A first system parameter 7 is connected in the feedback loop between the first integrator 5 and the third summer 6. A second system parameter 8 is connected in the feedback loop between the first integrator 5 and the second summer 4. A second integrator 9 is connected to receive as input thereto the output of the third summer 6 and to provide an output which is fed back to the third summer 6 through a third system parameter 10 and as an input to the second summer 4 through a fourth system parameter 11. It will be noted that a second gain element $k_2$ can be connected between the first summer 3 and the second summer 6; also, the values of the first and fourth system parameters are equal and the values of the second and third system parameters are equal.

Functionally, the operations depicted by the functional diagram are given in this paragraph. The input to the estimator 101 is designated in the FIGURE as $\dot{z}(t)$, where $\dot{z}(t) = x_1(t) + \dot{n}(t)$, as before noted. The input $\dot{z}(t)$ is combined in the summer 3 with the system output $\hat{x}_1(t)$, the output of the summer 3 being fed to gain elements $k_1$ and $k_2$ the outputs of which are respectively $k_1[\dot{z}(t) - \hat{x}_1(t)]$ and $k_2[\dot{z}(t) - \hat{x}_1(t)]$. The system output $\hat{x}_1(t)$, as shown in the FIGURE and as above discussed, is used as a feedback in the estimation process; thus, the second parameter 8 performs a multiplication function to give $(1/2\tau_d) \cdot \hat{x}_1(t)$ as a negative feedback input to the summer 4, the first parameter 7 performs a multiplication function to give $\omega_c \cdot \hat{x}_1(t)$ as a negative feedback input to the summer 6, and $\hat{x}_1(t)$ is fed back negatively without modification to the summer 3. The summer 6 acts to provide the combined function $$k_2[\dot{z}(t) - \hat{x}_1(t)] - \omega_c \cdot \hat{x}_1(t) - \frac{1}{2\tau_d} \cdot \hat{x}_2(t),$$

where $\hat{x}_2(t)$ is the integrated (integrator 9) output of the summer 6. The summer 4 acts to provide the combined function $$\hat{x}_2(t) \cdot \omega_c + k_1[\dot{z}(t) - \hat{x}_1(t)] - \frac{1}{2\tau_d} \cdot \hat{x}_1(t),$$

this combined function being integrated by the first integrator 5 to give the estimate $\hat{x}_1(t)$. In the phase-lock loop 101 the first and second gain elements $k_1$ and $k_2$, respectively, are related to the values of the system parameters by the relationships noted in the expressions (3), (4) and (5), as above noted.

The system herein described is a linear, minimum-variance, unbiased estimator which can take the form of an analog device wherein discrete electrical circuit elements provide the function depicted by the functional elements noted in the FIGURE and can be made employing integrated circuit techniques. It is not necessary nor even desirable to designate particular elements and their values since the choice of the same are well within the skill of persons skilled in the art and because the particular values chosen will depend, among other things, on the frequency of the input, etc. Furthermore, the functions can be performed in a general purpose digital computer properly programmed so that it will act in the manner required by the function diagram.

Modifications of the invention herein described will occur to persons skilled in the art and all such modifications are considered to be within the spirit and scope of the invention as defined in the appended claims.

What is claimed is:

1. A first-order phase-lock loop that comprises, in combination: a first summer to receive an input which contains a signal corrupted by noise; a first gain element connected to receive as input thereto the output of the first summer; a second summer connected to receive as an input thereto the output of said first gain element; a first integrator connected to receive as input thereto the output of the second summer and to provide an output which is the estimate of the signal, the output of the first integrator being fed back negatively as one input to each of the first and second summers and as one negative input to a third summer, a first system parameter means connected in the feedback loop between the first integrator and the third summer; a second system parameter means connected in the feedback loop between the first integrator and the second summer; and a second integrator connected to receive as input thereto the output of the third summer and to provide an output which is fed back to the third summer through a third system parameter means and as an input to the second summer through a fourth system parameter means.

2. A first-order phase-lock loop as claimed in claim 1 which further includes a second gain element connected between the first and third summers.

3. A first order, phase-lock loop as claimed in claim 2 in which the values of the first and fourth system parameter means are equal and in which values of the second and third system parameters are equal.

4. A first-order, phase-lock loop as claimed in claim 3 in which the first and second gain elements are related to the values of the system parameter means by the following relationship:

$$0 = -\frac{N_0 k_1}{2\tau_d} + \omega_c N_o k_2 + \frac{A}{\tau_d} - \frac{N_o}{2} k_1^2,$$

$$0 = -\frac{N_o k_2}{2\tau_d} + \omega_c \cdot x - \frac{N_o k_1}{2} - \frac{N_o k_1 k_2}{2},$$

$$0 = -\omega_c N_o k_2 - \frac{x}{\tau_d} + \frac{A}{\tau_d} - \frac{N_o k_2^2}{2},$$

where
- $k_1$, $k_2$ are the first and second gain elements, respectively,
- $x$ is a dummy variable,
- $\omega_c$ is the nominal carrier frequency, as well as the first and the fourth system parameter means,
- $N_o/2$ is the channel noise spectral power density,
- $A$ is the signal power,
- $\tau_d$ is the time for rms transmitter phase error to reach one radian, and
- $(1/2\tau_d)$ is the second and the third system parameter means.

5. A first order phase-lock loop system that comprises, in combination: first summer means to receive a system input which contains a signal corrupted by noise; gain element means connected to receive as input thereto the output of the first summer means; second summer means connected to receive as an input thereto the output of said gain element means; first integrator means connected to receive as input thereto the output of the second summer means and to provide an output which is an estimate of the signal, the output of the first integrator being fed back negatively as an input to the first summer means and as one negative input to a third summer means; system parameter means connected in the feedback loop between the first integrator means and the third summer means; and second integrator means connected to receive as input thereto the output of the third summer means and to provide an output which is fed as an input to the second summer means through another system parameter means.

* * * * *